United States Patent
Tsuda et al.

[19]

[11] Patent Number: 6,143,623
[45] Date of Patent: Nov. 7, 2000

[54] METHOD OF FORMING A TRENCH ISOLATION FOR SEMICONDUCTOR DEVICE WITH LATERAL PROJECTIONS ABOVE SUBSTRATE

[75] Inventors: Nobuyuki Tsuda; Hideki Fujikake, both of Tokyo, Japan

[73] Assignee: Nippon Steel Corporation, Tokyo, Japan

[21] Appl. No.: 09/468,224

[22] Filed: Dec. 20, 1999

Related U.S. Application Data

[62] Division of application No. 09/038,111, Mar. 11, 1998, Pat. No. 6,020,622.

[30] Foreign Application Priority Data

Apr. 25, 1997 [JP] Japan ..................................... 9-123053

[51] Int. Cl.[7] .................................................. H01L 21/76
[52] U.S. Cl. .......................... 438/425; 438/424; 438/426; 148/DIG. 50
[58] Field of Search ..................................... 438/424, 425, 438/426, 435, 437; 148/DIG. 50

[56] References Cited

U.S. PATENT DOCUMENTS 5,234,861  8/1993  Roisen et al. ..................... 148/DIG. 50
6,017,800  1/2000  Sayama et al. .......................... 438/424

*Primary Examiner*—Trung Dang
*Attorney, Agent, or Firm*—Pollock, Vande Sande & Amernick, RLLP

[57] ABSTRACT

A semiconductor device includes a semiconductor substrate in which a trench for element isolation is formed, and an element isolation oxide film buried into the trench in such a manner that the element isolation oxide film is projected from the surface of the semiconductor substrate. The element isolation oxide film which is an element isolation insulating film for defining an element forming region on the semiconductor substrate has a projection portion above the surface of the semiconductor substrate. The projection portion has the width wider than that of the trench. The projection portion and a contact portion made in contact with the semiconductor substrate within the trench are made of thermal oxide films, and a portion other than the projection portion and the contact portion is made of a CVD dioxide film.

12 Claims, 4 Drawing Sheets

METHOD OF FORMING A TRENCH ISOLATION FOR SEMICONDUCTOR DEVICE WITH LATERAL PROJECTIONS ABOVE SUBSTRATE

This application is a divisional of application Ser. No. 09/038,111 filed Mar. 11, 1998 now U.S. Pat. No. 6,020,622.

BACKGROUND OF THE INVENTION

1. Field of the Invention

The present invention generally relates to a semiconductor device and a fabrication method of a semiconductor device, and more specifically, to such a semiconductor device having a trench type element isolation structure and a fabrication method of the same.

2. Description of the Related Art

As element isolation techniques in semiconductor devices, the LOCOS (local oxidation of silicon) method is the most popular element isolation method, in which a thermal oxide film is selectively formed at an element isolation region. However, in the LOCOS method, when an oxide film is formed, an enlargement of an oxide film region called as a "bird's beak" will occur along a transverse direction. As a result, an element forming region becomes narrower than a designed value of the element forming region. Consequently, it is difficult in practice to isolate such element forming regions, the interval of which is shorter than, or equal to 1 micron.

To solve this problem of the LOCOS method, a trench type element isolation structure has been proposed in which a trench is formed in a semiconductor substrate, and then an oxide film is buried into the formed trench. However, such a trench type element isolation structure has the following problem. That is, when the surface of the insulating film buried into the trench formed in the semiconductor substrate becomes lower than the surface of the semiconductor substrate, and a stepped portion is produced at an edge portion of the trench, electric field concentration may occur at the edge portion, and therefore leakage currents may be increased. Under such a circumstance, the two manufacturing methods described below for the trench type element isolation structures having no such stepped portion have been proposed.

(1) JP-A-7-176604 discloses a trench type element isolation structure capable of rounding the corners of the silicon substrate in the following manner in order to mitigate the electric field concentration occuring at the edge portion of the buried element isolation region, which is caused by the stepped portion between the surface of the buried element isolation region and the surface of the silicon substrate. That is, after the first oxide film formed on the silicon substrate is side-etched, the third oxide film is formed by thermal oxidation method, which is employed to remove the defect and the like produced in the silicon substrate when the element isolation trench is formed. At this time, the edge portion of the silicon substrate exposed by side-etching the first oxide film is oxidized by way of the thermal oxidation. Also, the volume of the polycrystalline silicon film formed on the first oxide film is expanded by way of the thermal oxidation. As a consequence, the corner of the silicon substrate is rounded. However, even in the trench type element isolation structure, since the corner of the silicon substrate is rounded, there is a problem that the element forming region is narrowed.

(2) JP-A-5-47919 discloses the trench type element isolation structure in which the $SiO_2$ film buried in the trench groove of the silicon substrate is grown by selective oxidation to form the rounded portion at the edge portion of the element forming region, so that both the bird's beak and the bird's head are formed. However, the trench type element isolation structure is directed to the improvement in the gate withstanding voltage and the leakage current failure in the MOS-type FET, and since both the bird's beak and the bird's head are formed, there is a problem that the element forming region is narrowed.

SUMMARY OF THE INVENTION

An object of the present invention is to provide a semiconductor device having a trench type element isolation structure without forming a bird's beak, and a fabrication method of such a semiconductor device.

To achieve the above-described object, a semiconductor device according to an aspect of the present invention includes: a semiconductor substrate in which a trench for element isolation is formed; and an element isolation oxide film buried into the trench in such a manner that the element isolation oxide film is projected from a surface of the semiconductor substrate, wherein the element isolation oxide film has a projection portion above the surface of the semiconductor substrate, the projection portion having a width wider than a width of the trench.

A fabrication method of a semiconductor device according to an aspect of the present invention comprises: a first step of forming a first oxide film on a semiconductor substrate; a second step of forming an easily oxidizable film on the first insulating film; a third step of forming an anti-oxidation insulating film on the easily oxidizable film; a fourth step of patterning the anti-oxidation insulating film; a fifth step of etching the easily oxidizable film, the first oxide film and the semiconductor substrate by using the patterned anti-oxidation insulating film as a mask to thereby form a trench in the easily oxidizable film, the first oxide film and the semiconductor substrate; a sixth step of oxidizing an exposed portion of the easily oxidizable film, which is exposed from a side surface of the trench, to thereby form a second oxide film, and oxidizing an exposed portion of the semiconductor substrate, which is exposed from bottom and side surfaces of the trench, to thereby form a third oxide film; a seventh step of forming a fourth oxide film on the anti-oxidation insulating film in such a manner that the trench is buried by the fourth oxide film; an eighth step of polishing the fourth oxide film to thereby expose the anti-oxidation insulating film; and a ninth step of removing the anti-oxidization film, the easily oxidizable film and the first oxide film to thereby form an element isolation oxide film containing at least the second to fourth oxide films.

Alternatively, in the ninth step, only the anti-oxidation film and the easily oxidizable film may be removed.

BRIEF DESCRIPTION OF THE DRAWINGS

A more complete understanding of the teachings of the present invention may be acquired by referring to the accompanying drawings, in which.

DESCRIPTION OF THE PREFERRED EMBODIMENTS

Figure 1:
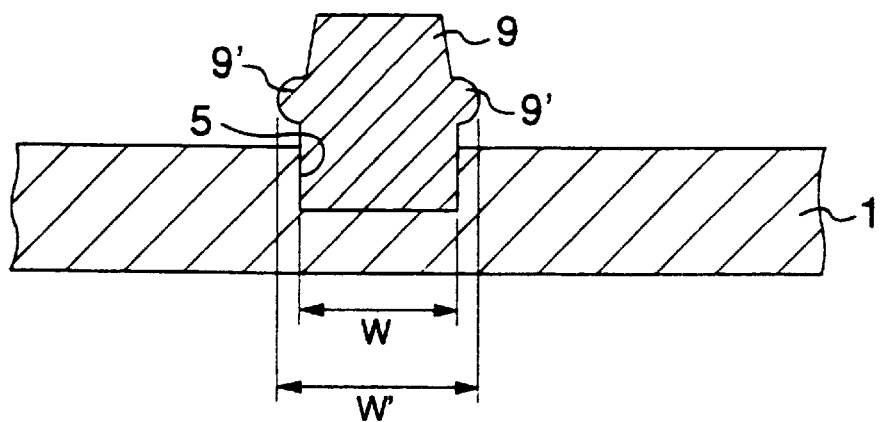
FIG. 1 is a sectional view of a semiconductor device according to an embodiment of the present invention.

As shown in FIG. 1, a semiconductor device according to an embodiment of the present invention contains a semiconductor substrate 1 in which a trench 5 for element isolation is formed, and a silicon oxide film 9 buried into the trench 5 in such a manner that the silicon oxide film 9 is projected from the surface of the semiconductor substrate 1. The silicon oxide film 9 has a projection portion 9' which has a width W' wider than a width W of the trench 5 and is located above the surface of the semiconductor substrate 1.

Referring now to FIGS. 2A to 2D and FIGS. 3A to 3E, a description will be made of a fabrication method of the semiconductor device shown in FIG. 1.

Figure 2A:
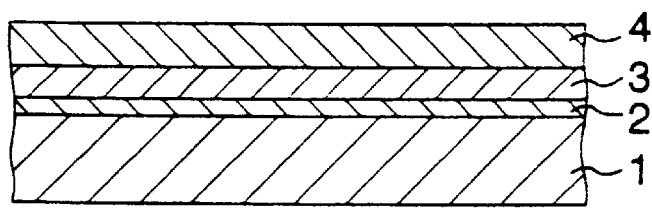
FIGS. 2A to 2D are sectional views for showing a fabrication method of the semiconductor device shown in FIG. 1.
Figure 2B:
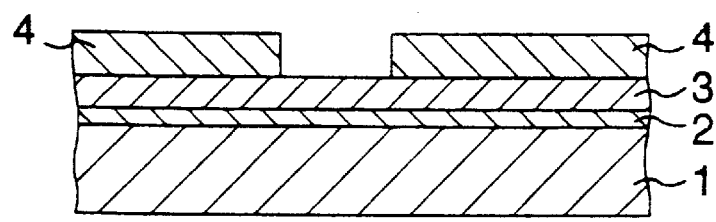

As shown in FIG. 2A, a first oxide film (thermal oxide film) 2 having a thickness of about 100 angstroms is formed on the P-type silicon semiconductor substrate 1 under a temperature condition of 800° C. by using the oxidation diffusion technique. Thereafter, a polycrystalline silicon film (easily oxidizable film) 3 having a thickness of about 500 angstroms is formed on the first oxide film 2 under a temperature condition of 620° C. by employing the CVD (Chemical Vapor Deposition) method. A silicon nitride film (anti-oxidation insulating film) 4 having a thickness of about 1,500 angstroms is formed on the polycrystalline silicon film 3 under a temperature condition of 780° C. by way of the CVD method, and then the silicon nitride film 4 is patterned by utilizing both the photolithography technique and the anisotropic etching process to expose a portion of the polycrystalline silicon film 3, as shown in FIG. 2B. In this case, the anisotropic etching process of the silicon nitride film 4 is carried out by employing a parallel plate type etching chamber in the atmosphere of $CF_4/Ar=120/800$ sccm, 1.7 Torr and 750 W.

Figure 2C:
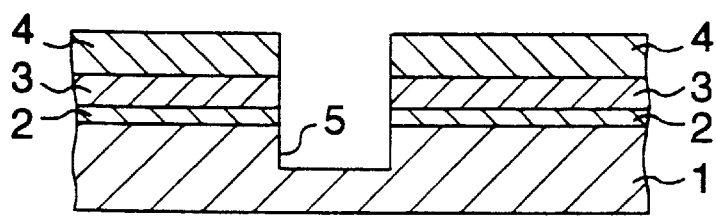
Figure 2D:
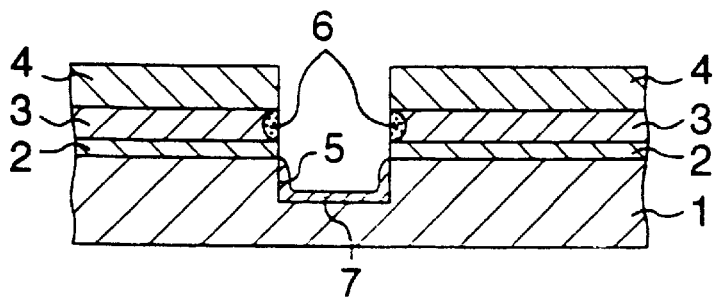

Subsequently, the polycrystalline silicon film 3, the first oxide film 2 and the semiconductor substrate 1 are etched using the patterned silicon nitride film 4 as a mask to form the trench 5 for element isolation, which has a depth of approximately 0.7 $\mu$m, into the polycrystalline silicon film 3, the first oxide film 2 and the semiconductor substrate 1, as shown in FIG. 2C. At this step, the etching process operation is carried out by using the parallel plate type etching chamber in the atmosphere of $He/HBr/Cl_2=400/15/200$ sccm, 425 mToor and 225 W.

Subsequently, both the exposed portion of the polycrystalline silicon film 3, which is exposed from the side surface of the trench 5, and the exposed portion of the semiconductor substrate 1, which is exposed from the side and bottom surfaces of the trench 5, are oxidized under a temperature condition of 800° C. As a result, a second oxide film (thermal oxide film) 6 having a thickness of about 200 angstroms and a third oxide film (thermal oxide film) 7 having a thickness of about 150 angstroms are formed (see FIG. 2D).

Figure 3A:
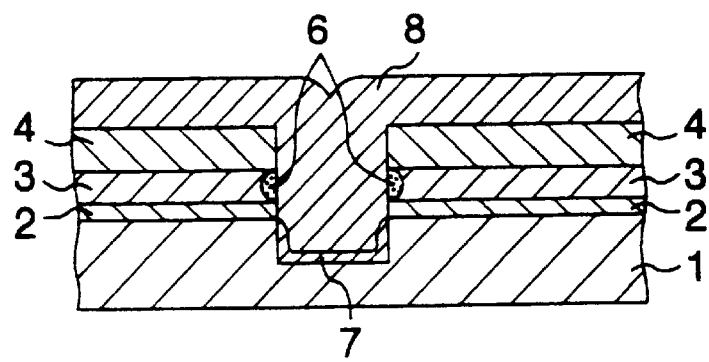
FIGS. 3A to 3E are sectional views for showing the fabrication method of the semiconductor device shown in FIG. 1.
Figure 3B:
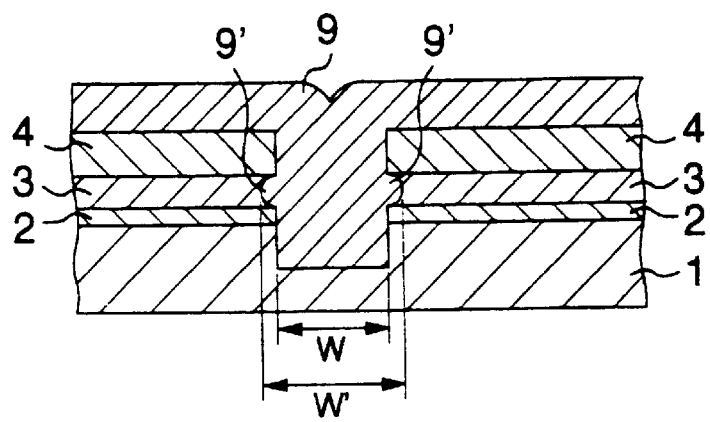
Figure 3C:
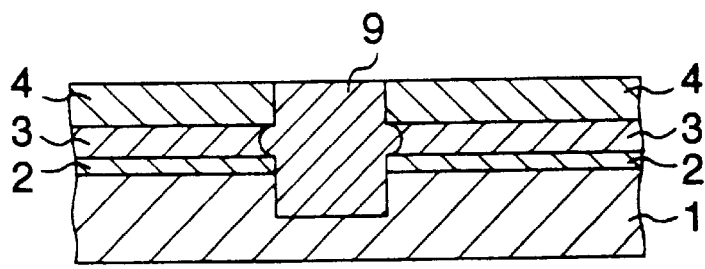

Subsequently, as shown in FIG. 3A, a fourth oxide film (chemical-vapor-deposited silicon dioxide film) 8 having a thickness of about 10,000 angstroms is deposited on the entire surface of the semiconductor substrate 1 under a temperature condition of 680° C. by way of the CVD method in such a manner that the trench 5 is filled up with the fourth oxide film 8. In this case, as shown in FIG. 3B, the fourth oxide film 8 may constitute an element isolation oxide film 9 in combination with the second oxide film 6 and the third oxide film 7. As a consequence, the element isolation oxide film 9 is fabricated in such a manner that the element isolation oxide film 9 has above the surface of the semiconductor substrate 1 the projection portion 9' which has the width W' wider than the width W of the trench 5. Thereafter, the element isolation oxide film 9 is polished using the chemical mechanical polishing method (CMP method), so that the element isolation oxide film 9 is polished until the silicon nitride film 4 is exposed, as shown in FIG. 3C. In this case, the chemical mechanical polishing process operation is carried out under the condition of the rotation speed=70 rpm and the pressure=300 $g/cm^2$.

Figure 3D:
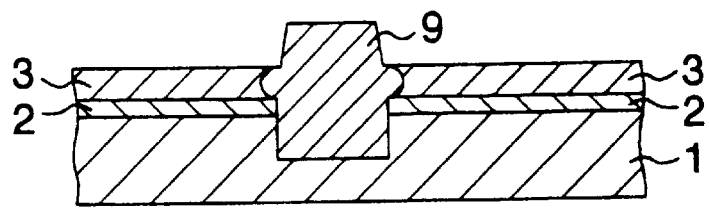

Subsequently, as shown in FIG. 3D, the silicon nitride film 4 is removed by using a 170° C. thermal phosphoric acid fluid. At this time, a portion of the element isolation oxide film 9 is also removed. However, since the element isolation oxide film 9 has the projection portion 9' in the trench 5 formed in the polycrystalline silicon film 3 and furthermore the projection portion 9' is covered with the polycrystalline silicon film 3 when the silicon nitride film 4 is removed, there is no risk that the portion of the element isolation oxide film 9 lower than the surface of the semiconductor substrate 1 is removed. As a result, no stepped portion is produced at the trench 5.

Figure 3E:
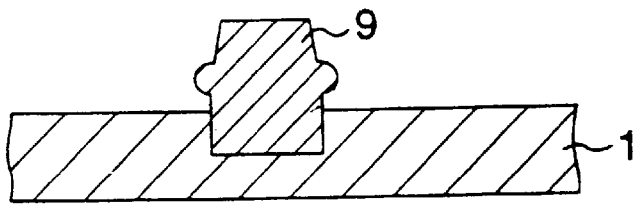

Subsequently, as shown in FIG. 3E, both the polycrystalline silicon film 3 and the first oxide film 2 are removed, so that the trench type element isolation structure without bird's beaks may be completed.

It should be noted that at the fabricating step of FIG. 3E, both the polycrystalline silicon film 3 and the first oxide film 2 may be removed by employing an etching process technique. In this alternative case, the two removing methods described below may be employed:

(1) A removing method in which both the polycrystalline silicon film 3 and the first oxide film 2 are anisotropic-etched in a batch manner.

Figure 4A:
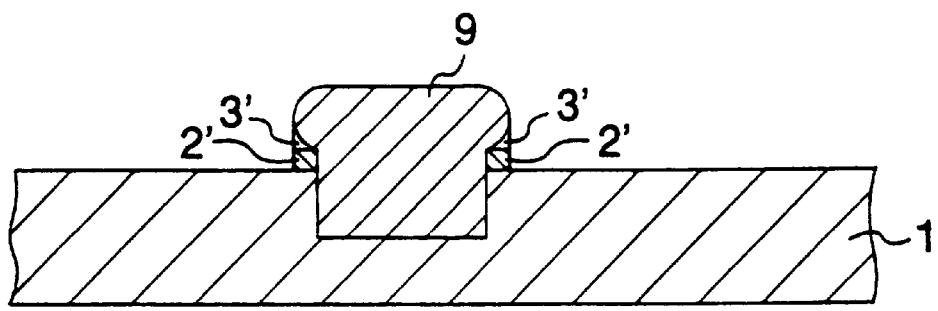
FIGS. 4A and 4B are sectional views for showing a trench isolation structure formed in such a case that a polycrystalline silicon film and a first oxide film are anisotropic-etched in a batch mode at the fabricating step shown in FIG. 3E.
Figure 4B:
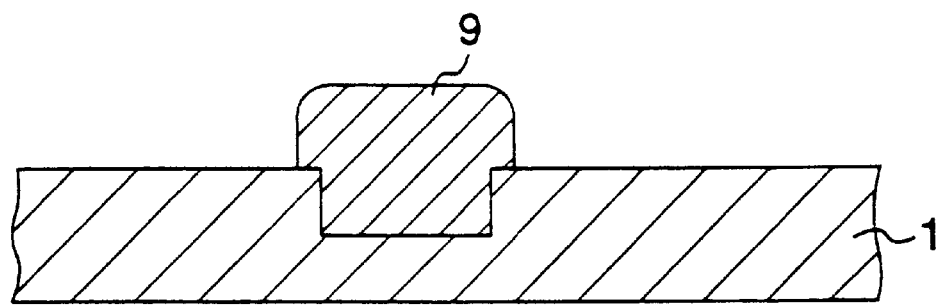

In accordance with this removing method, the upper portion of the element isolation oxide film 9 is also etched, and similarly the upper portion of the projection portion 9' is slightly etched. Under the projection portion 9' of the element isolation oxide film 9, both a portion 3' of the polycrystalline silicon 3 and a portion 2' of the first oxide film 2 are left after the etching process, as shown in FIG. 4A. The remaining portion 3' of the polycrystalline silicon film 3 is thermally oxidized in, for instance, the thermal oxidizing process at the step of forming the gate oxide film which is carried out later, so that the remaining portion 3' becomes an oxide film. As a result, in accordance with the removing method, the element isolation oxide film 9, the portion 3' of the polycrystalline silicon 3 which becomes the oxide film, and the portion 2' of the first oxide film 2 are made in an integral form, so that the trench isolation structure as shown in FIG. 4B is completed.

(2) A removing method in which the polycrystalline silicon film 3 is anisotropic-etched and the first oxide film 2 is isotropic-etched.

Figure 5:
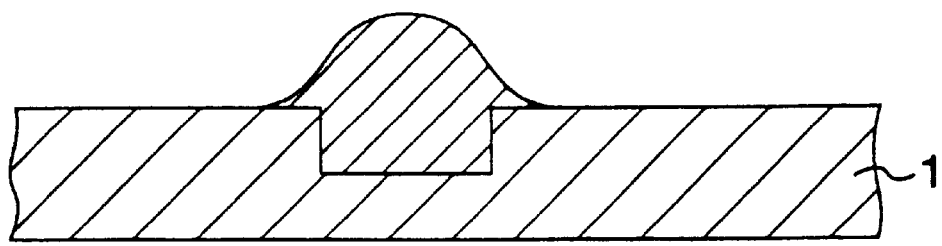
FIG. 5 is a sectional view for showing a trench isolation structure formed in such a case that the polycrystalline silicon film is anisotropic-etched and the first oxide film is isotropic-etched at the fabricating step shown in FIG. 3E.

In accordance with this removing method, when the first oxide film 2 is isotropic-etched, since the etching rate of the element isolation oxide film 9, which is the CVD dioxide film, is higher than the etching rate of the first oxide film 2, which is the thermal oxide film, both the upper portion of the element isolation oxide film 9 and the projection 9' are etched considerably. Also, under the projection portion 9' of the element isolation oxide film 9, the etching process for the first oxide film 2 is slightly impeded because the projection portion 9' functions as a mask. As a consequence, in accordance with this removing method, the trench isolation structure as shown in FIG. 5 is formed.

It should be noted that although both the polycrystalline silicon film 3 and the first oxide film 2 are removed at the step shown in FIG. 3E, only the polycrystalline silicon film 3 may be removed and also the first oxide film 2 may be utilized as, for instance, a gate oxide film. Furthermore, instead of the polycrystalline silicon film 3, another easily oxidizable film such as an amorphous silicon film may be utilized.

Similar to the fabricating method of the present embodiment, namely as the method of forming the trench type element isolation structure by thermally oxidizing the exposed portion of the polycrystalline silicon film, there is the fabricating method disclosed in JP-A-9-8118. In the disclosed method, after the polysilicon constituting one of the masking films used to etch the silicon substrate is etched by way of the photolithography technique, the thermal oxide film is widened along the transverse direction by way of the thermal oxidation. Thereafter, the silicon substrate is etched, so that the V-shaped trench capable of easily burying the BPSG film thereinto is formed. However, since the formation of the thermal oxide film into the polycrystalline silicon is directed to form such a V-shaped trench, the thermal oxide film is removed after the V-shaped trench is formed, and therefore is not utilized as the element isolation film.

Next, referring now to FIGS. 6A to 6D, a description will be made of a fabrication method of an NMOS transistor having the trench type element isolation structure shown in FIG. 3E.

Figure 6A:
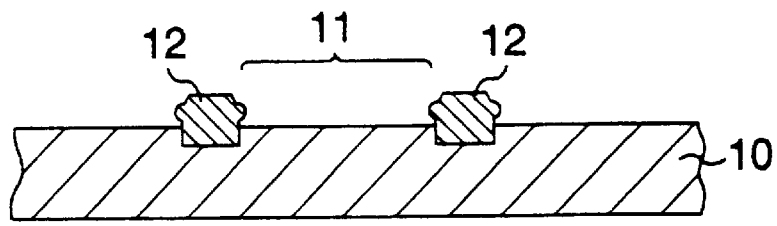
FIGS. 6A to 6D are sectional views for showing a fabrication method of an NMOS transistor having the trench isolation structure shown in FIG. 3E.
Figure 6B:
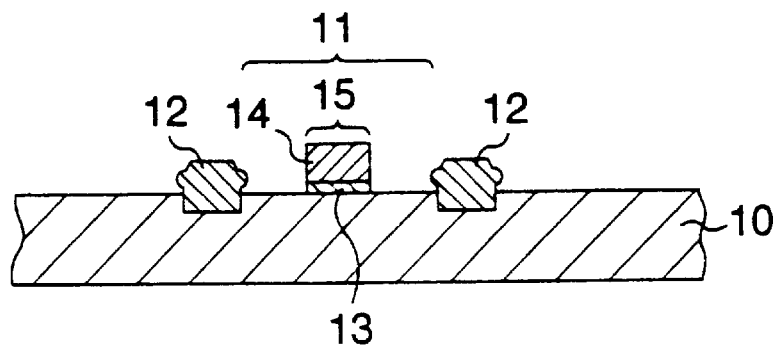

While executing the fabricating steps similar to those shown in FIGS. 2A to 2D and FIGS. 3A to 3E, an element isolation oxide film 12 used to define an element forming region 11 is formed in a P-type silicon semiconductor substrate 10, as shown in FIG. 6A. Thereafter, a gate oxide film 13 is formed on the semiconductor substrate 10 at the element forming region 12, and then a polycrystalline silicon film 14 is deposited on the gate oxide film 13 by way of the CVD method. Thereafter, the polycrystalline silicon film 14 and the gate oxide film 13 are patterned by the photolithography technique and the dry etching process to form a gate electrode 15, as shown in FIG. 6B.

Figure 6C:
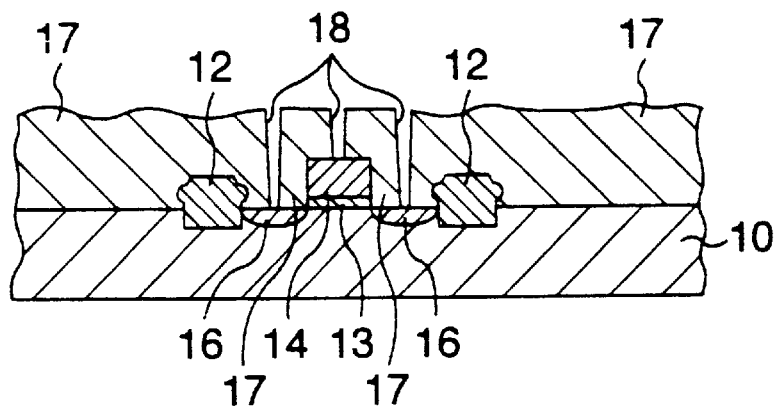

Subsequently, while using the gate electrode 15 as a mask, an N-type impurity such as arsenic (As) is implanted into the semiconductor substrate 10 at the element forming region 12 by way of the ion implantation method. Thereafter, as shown in FIG. 6C, N-type impurity diffusion layers 16 are formed on both sides of the gate electrode 15 by the thermal diffusion. Thereafter, an interlevel insulating film 17 is formed on the entire surface of the semiconductor substrate 10 in such a manner that the element isolation oxide film 12 is buried by the interlevel insulating film 17, and then contact holes 18 are formed in the interlevel insulating film 17 to expose a portion of each of the N-type impurity diffusion layers 16 and a portion of the polycrystalline silicon film 14 on the gate electrode 15.

Figure 6D:
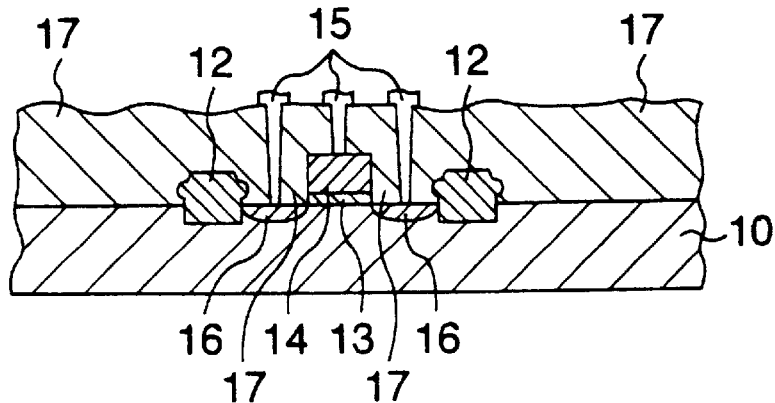

Subsequently, an aluminum film is deposited on the entire surface of the semiconductor substrate 10 in such a manner that the contact holes 18 are filled up with the aluminum film, and then the deposited aluminum film is patterned by way of the photolithography technique and the dry etching process to form aluminum wirings 15, as shown in FIG. 6D. Thereafter, thermal treatment is carried out under a temperature condition of 500° C., so that the electric connections between aluminum and silicon can be established under better conditions. As a result, the NMOS transistor can be completed.

In the NMOS transistor fabricated in this manner, there is no such problem that the bird's beak is formed when the oxide film is formed by way of the LOCOS method. As a consequence, the NMOS transistor can be manufactured with the very fine patterns. Also, since the surface of the element isolation oxide film 12 at the edge of the element isolation region is not located lower than the surface of the semiconductor substrate 10, it is possible to suppress the formation of the parasitic transistor, and furthermore to suppress the occurrence of leakage currents caused by the field concentration occurring in the edges of the element isolation region.

What is claimed is:

1. A fabrication method of a semiconductor device having a trench type element isolation structure, comprising:

a first step of forming a first oxide film on a semiconductor substrate;

a second step of forming an easily oxidizable film on said first oxide film;

a third step of forming an anti-oxidation insulating film on said easily oxidizable film;

a fourth step of patterning said anti-oxidation insulating film;

a fifth step of etching said easily oxidizable film, said first oxide film and said semiconductor substrate using said patterned anti-oxidation insulating film as a mask to thereby form a trench in said easily oxidizable film, said first oxide film and said semiconductor substrate;

a sixth step of oxidizing an exposed portion of said easily oxidizable film, which is exposed from a side surface of said trench, to thereby form a second oxide film, and oxidizing an exposed portion of said semiconductor substrate, which is exposed from bottom and side surfaces of said trench, to thereby form a third oxide film;

a seventh step of forming a fourth oxide film on said anti-oxidation insulating film in such a manner that said trench is buried by said fourth oxide film;

an eighth step of polishing said fourth oxide film to thereby expose said anti-oxidation insulating film; and a ninth step of removing said anti-oxidization film, said easily oxidizable film and said first oxide film to thereby form an element isolation oxide film containing at least said second to fourth oxide films.

2. A fabrication method of a semiconductor device as claimed in claim 1, wherein:

said first to third oxide films are thermal oxide films;

said easily oxidizable film is one of a polycrystalline silicon film and an amorphous silicon film;

said anti-oxidation insulating film is a silicon nitride film; and said fourth oxide film is a chemical-vapor-deposited silicon dioxide film.

3. A fabrication method of a semiconductor device as claimed in claim 2, wherein said ninth step includes a step of anisotropic-etching said easily oxidizable film and said first oxide film in a batch manner.

4. A fabrication method of a semiconductor device as claimed in claim 2, wherein said ninth step includes a step of anisotropic-etching said easily oxidizable film and a step of isotropic-etching said first oxide film.

5. A fabrication method of a semiconductor device as claimed in claim 1, further comprising a tenth step of forming a transistor at an element forming region defined by said element isolation oxide film.

6. A fabrication method of a semiconductor device having a trench type element isolation structure, comprising:

- a first step of forming a first oxide film on a semiconductor substrate;
- a second step of forming an easily oxidizable film on said first oxide film;
- a third step of forming an anti-oxidation insulating film on said easily oxidizable film;
- a fourth step of patterning said anti-oxidation insulating film;
- a fifth step of etching said easily oxidizable film, said first oxide film and said semiconductor substrate using said patterned anti-oxidation insulating film as a mask to thereby form a trench in said easily oxidizable film, said first oxide film and said semiconductor substrate;
- a sixth step of oxidizing an exposed portion of said easily oxidizable film, which is exposed from a side surface of said trench, to thereby form a second oxide film, and oxidizing an exposed portion of said semiconductor substrate, which is exposed from bottom and side surfaces of said trench, to thereby form a third oxide film;
- a seventh step of forming a fourth oxide film on said anti-oxidation insulating film in such a manner that said trench is buried by said fourth oxide film;
- an eighth step of polishing said fourth oxide film to thereby expose said anti-oxidation insulating film; and
- a ninth step of removing said anti-oxidization film and said easily oxidizable film.

7. The method of claim 1 wherein in said ninth step, said first oxide film and said easily oxidizable film remain in areas under said second oxide film.

8. The method of claim 7 wherein said ninth step further comprises etching a top surface of said fourth oxide film to form a projection portion with substantially vertical sidewalls.

9. The method of claim 3 wherein said fourth oxide film is also etched by said anisotropic-etching.

10. The method of claim 4 further comprising etching said fourth oxide film along with said first oxide film.

11. The method of claim 10 wherein said fourth oxide film has a higher etch rate than said first oxide film.

12. The method of claim 10 wherein said fourth oxide film is etched to have a substantially convex shape.

* * * * *